United States Patent [19]

Brunnenmeyer

[11] Patent Number: 4,846,705
[45] Date of Patent: Jul. 11, 1989

[54] BACKPLAN CONNECTOR

[75] Inventor: Dennis D. Brunnenmeyer, Penn Valley, Calif.

[73] Assignee: The Grass Valley Group, Inc., Grass Valley, Calif.

[21] Appl. No.: 843,825

[22] Filed: Mar. 25, 1986

Related U.S. Application Data

[63] Continuation of Ser. No. 721,523, Apr. 9, 1985, abandoned.

[51] Int. Cl.$^4$ ............................................... H01R 9/09
[52] U.S. Cl. ....................................... 439/78; 361/413
[58] Field of Search ............. 339/17 R, 17 LM, 17 L, 339/17 M, 14 R; 361/407, 414, 413; 439/55, 59, 69, 78

[56] References Cited

U.S. PATENT DOCUMENTS

| | | | |
|---|---|---|---|
| 3,587,029 | 2/1971 | Knowles | 339/176 MP |
| 3,721,941 | 3/1973 | Wisser | 339/192 R |
| 3,923,359 | 12/1975 | Newsam | 339/17 M |
| 4,068,915 | 1/1978 | Evans | 339/176 MP |
| 4,494,172 | 1/1985 | Leary et al. | 361/414 |

Primary Examiner—Neil Abrams
Attorney, Agent, or Firm—Francis I. Gray; John Smith-Hill

[57] ABSTRACT

Electrical apparatus comprises a backplane board of dielectric material and at least one run of conductive material. An aperture extends through the dielectric material and through the run of conductive material. A conductor member may be connected to the run of conductive material by means of a connector comprising a first connector member secured to the conductor member and a second connector member that is mechanically mateable with the first connector member. One of the connector members has an essentially rigid elongate member of conductive material that is embedded in a block of dielectric material and can be inserted into the aperture from one side of the board to contact the run of conductive material and that, when so inserted, projects from the other side of the board. The block of dielectric material prevents inadvertent contact with the live electrical conductors of the backplane. The other connector member comprises a receptacle of dielectric material that can be fitted onto the projecting portion of the elongate member.

11 Claims, 2 Drawing Sheets

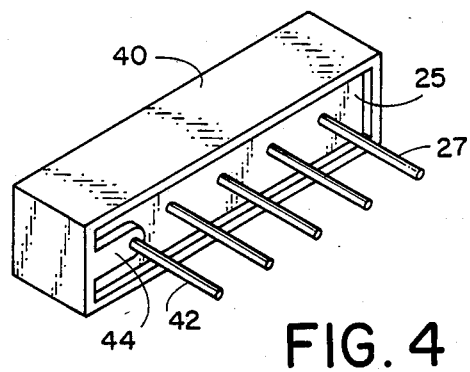

BLACKPLAN CONNECTOR

This is a continuation of application Ser. No. 721,523 filed Apr. 9, 1985 and now abandoned.

This invention relates to backplane connectors for electrical apparatus.

BACKGROUND OF THE INVENTION

Many forms of electronic apparatus are mounted in a casing having side walls, top and bottom walls, and a front panel which carries control elements, such as switches, and condition indicating elements, such as gauges and indicator lamps. The casing is closed at the rear, i.e. opposite the front panel, by a backplane. The backplane is fitted to the casing when the various components of the apparatus have been assembled and placed in position inside the casing. The backplane serves several purposes. For example, the backplane prevents stray material from entering the interior of the casing and possibly causing damage to the electronic apparatus, and also shields the user of the apparatus from unintended contact with components located inside the casing. In addition, the backplane generally carries connector receptacles whereby connection is made between the apparatus and external cables.

The backplane itself usually performs an interconnect function within the apparatus, and may be constructed as a printed circuit board. That is to say, the backplane is made of dielectric material and carries at least one run or trace of electrolessly deposited metal that has been etched to a predetermined pattern and to which connection to different components of the apparatus is made at at least two locations. The circuit board may have a single layer of metal within which the traces are delineated, or it may have multiple layers of dielectric material laminated together and each carrying a layer of conductive material that forms one or more circuit traces.

It is also common for electronic apparatus to include so-called interior backplanes or mother boards which perform similar electrical functions to the backplane proper but are not located at the exterior of the apparatus and therefore are not accessible to the user of the apparatus in normal operation. Such an interior backplane is used as an interconnect element inside the apparatus.

One problem associated with conventional backplanes is that connection of conductors to the circuit runs of the backplane typically involves a soldering operation or use of compliant-pin, press-fit connector technology. Generally, a backplane has multiple circuit runs, and it is desired to connect the conductors of a ribbon cable or other multiple conductor cable to the conductor runs of the backplane. The connection must generally be detachable, and this has hitherto involved providing the cable with a detachable connector receptacle, such as a receptacle of the kind used on flat, flexible ribbon cables, and attaching the header portion of the connector to the backplane. The individual connector elements of the header may be connected to the circuit runs of the backplane by a hand soldering operation. It is not viable using current technology to use automatic soldering techniques for connecting the circuit runs to the conductive elements of the header portion of the connector. Compliant-pin, press-fit connector technology alleviates soldering problems, but use of existing components suitable for installation in backplanes for the purpose of facilitating electrical connections to the interior of the apparatus poses a second problem.

This second problem associated with making electrical connections to the interior of the apparatus from a rear backplane is that the operation of installing connector headers using either solder techniques or existing compliant-pin, press-fit technology causes the conductive elements (pins) of the headers to extend through to the outside surface of the backplane, thereby exposing the apparatus to potential damage by inadvertent earthing or shorting of the pins of the header by a careless user or by other accident. Further, such practices provide a potential hazard to users of the apparatus by exposing them to circuit voltages, emissions or other hazards associated with exposed electrical connections.

SUMMARY OF THE INVENTION

According to the present invention there is provided an electrical apparatus comprising a backplane board that comprises dielectric material and at least one run of conductive material that is selectively isolated from other conductive material by said dielectric material, the board being formed with an aperture that extends through the dielectric material and through said run of conductive material, whereby the conductive material is exposed at the interior of the aperture, and the apparatus also comprising a conductor member for connecting said run of conductive material to a component of the electrical apparatus, and connector means for establishing electrical connection between said run of conductive material and said conductor member, said connector means comprising a first connector member that is conductive and is secured to the conductor member, and a second connector member that is mechanically mateable with said first connector member, one of said connector members comprising an essentially rigid elongate member of conductive material that can be inserted into the aperture of the board from one side of the board to contact the run of conductive material and that, when so inserted, projects from the other side of the board, and the other connector member comprising a receptacle that can be fitted onto the portion of the elongate member that projects from said other side of the board, the connector means being such that when the elongate member is inserted into the aperture and its projecting portion is received in said receptacle, said first connection member is in electrical connection with said run of conductive material.

In the preferred embodiment of the invention, the second connector member is the one that comprises the elongate member, and the second connector member also includes a block of dielectric material from which the rigid elongate member projects, so that when the elongate member is inserted into the aperture of the board it establishes electrical connection with the conductor member by way of the first connector member and the elongate member is shielded from inadvertent contact by virtue of the block of dielectric material being in contact with the backplane board.

BRIEF DESCRIPTION OF THE DRAWINGS

For a better understanding of the invention, and to show how the same may be carried into effect, reference will now be made, by way of an example, to the accompanying drawings in which:

FIG. 4 is a perspective view of the header shown in FIG. 2.

DETAILED DESCRIPTION

Figure 1:
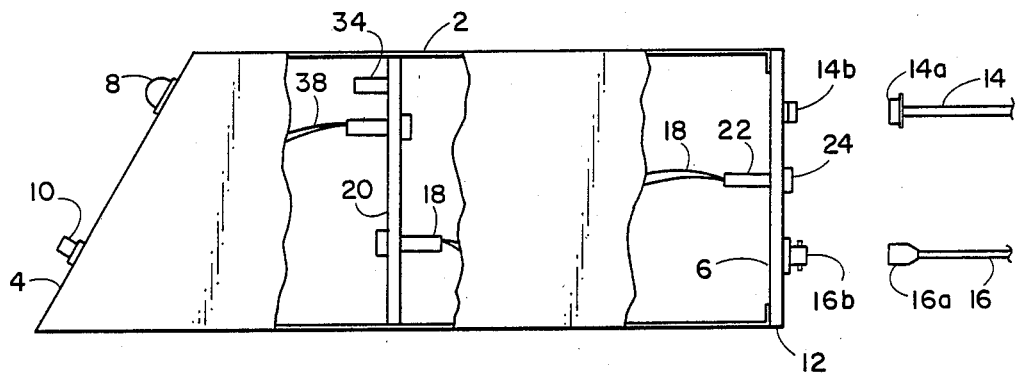
FIG. 1 shows a partial cross-sectional view of electronic apparatus including both an interior backplane and a backplane proper.

The apparatus shown in FIG. 1 comprises a casing 2 which may be made of sheet metal, injection-molded plastic or other material and includes a front panel 4. The casing defines a rear opening 6. The apparatus may be, for example, a television production switcher, although the type of apparatus is not directly relevant to the present invention. The front panel provides the user interface with the apparatus, and carries condition-indicating elements, such as a lamp 8, and interaction-executing elements, such as a pushbutton 10. The rear opening of the apparatus, which is provided in order to permit assembly of the apparatus and also to provide access to the interior of the casing for servicing and repair, is closed by a backplane 12 which is secured to flanges of the casing 2 by means that are not shown. The backplane 12 is a printed circuit board comprising layers 32 of dielectric material. At least one of the layers 32 carries at least one run 30 of conductive material conforming to a desired pattern. The layers of dielectric material are laminated together to form the backplane. As noted previously, the backplane could alternatively be a single layer circuit board.

The backplane serves as the electrical interface between the apparatus and its environment. Thus, electrical signals are delivered to or provided by the apparatus over cables 14 and 16 that terminate in plugs 14a and 16a that in turn engage receptacles 14b and 16b secured to the backplane. The individual terminals of the receptacles 14b and 16b are electrically connected to the runs of the backplane in conventional manner, e.g. by wave soldering. Connection is made between the connector runs of the backplane 12 and internal components of the apparatus 2 by way of a ribbon or other multiple-conductor cable 18, which may be either connected directly to the internal components or connected to the components through an interior backplane 20.

The cable 18 is connected to the backplane 12 by means of a receptacle 22. The receptacle 22 comprises a body of dielectric material having an array of receptacle contacts embedded therein, and is of the kind that forms one component of a compliant pin connector, for example as sold by AMP Incorporated, under part number 1-102666-1. The second component of a compliant pin connector is a header that comprises a body of dielectric material having conductive posts embedded therein, and the posts are inserted into the receptacle contacts of the receptacle when the two components are fitted together, establishing electrical contact between the posts and respective receptacle contacts. Such a header may be connected to a second length of a ribbon cable, with the individual conductors of the cable electrically connected to the posts, and upon physical engagement of the header with the receptacle, electrical connection is established between the conductors of the two ribbon cables, or it may be soldered or press-fit into a backplane, making electrical connection to other components mounted on the backplane and connected to the header by the conductor runs of the backplane. The apparatus shown in FIG. 1 comprises a header 24 that is similar to the header of a compliant pin connector, in that it comprises a body 25 of dielectric material and includes posts 27 that are interengageable with the receptacle contacts of the receptacle 22, but the posts are not accessible from the side of the body 25 that is opposite the side at which the posts project, and accordingly connection cannot be made to the posts otherwise than through their projecting portions.

Figure 3:
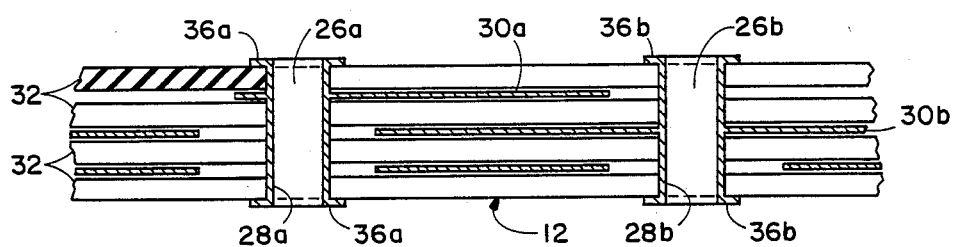
FIG. 3 is an enlarged sectional view of the backplane shown in FIG. 2.

The backplane is formed with an array of plated-through holes 26, arranged to receive the pins 27 of the header 24. The conductor runs 30 of the backplane are positioned so that those which are to be connected to the conductors of the cable 18 are traversed by the holes 26. During fabrication of the backplane, and after drilling of the holes 26, the interiors of the holes 26 are plated using known techniques so as to form a metal sleeve within each hole, as shown in FIG. 3 at 28. The plating thus constitutes an extension of the runs. The masks that are used to localize the plating result in annular conductive pads 36 being formed at the surfaces of the board around each sleeve 28. It will be seen in FIG. 3 that the sleeve 28a contacts the conductor run 30a that is pierced by the hole 26a, and that the run 30b, pierced by the hole 26b, is contacted by the sleeve 28b. Thus, electrical connection is established between the sleeves 28a and 28b and the runs 30a and 30b respectively. The posts of the header 24 are sized to press-fit snugly within the holes 26 making a gas-tight electrical connection, and accordingly when the header 24 is fitted to the backplane 12 the posts make electrical contact with the sleeves 28 and with the conductor runs that are electrically connected thereto. The ends of the posts project sufficiently beyond the backplane into the interior of the apparatus so that the receptacle 22 can be fitted onto the posts, thereby establishing electrical connection between the posts and the conductors of the ribbon or other cable. It will therefore be appreciated that the header serves to establish electrical connection between the conductor runs of the backplane and the conductors of the ribbon cable. This connection is established without need for any soldering. The block 25 shields the posts 27 from contact at the exterior of the apparatus, and is sized to cover the pads 36 at the exterior surface of the backplane, and therefore live electrical conductors are not exposed at the exterior of the apparatus even though connection is made between the conductor runs of the backplane and the ribbon cable by inserting conductive posts through the backplane.

As indicated above, the cable 18 may lead either to components that are located within the casing 2 or to the interior backplane 20. In the latter case, connections may be made between the conductors of the ribbon cable 18 and the conductor runs of the interior backplane 20 using a similar technique to that which is described with reference to the connector receptacle 22 and the header 24. The conductor runs of the backplane 20 establish electrical connection between the conductors of the cable 18 and conductors of another cable 38 which lead to components of the apparatus. Alternatively, the conductor runs of the interior backplane 20 may lead to connectors, such as an edge connector 34, for printed circuit boards (not shown).

Figure 2:
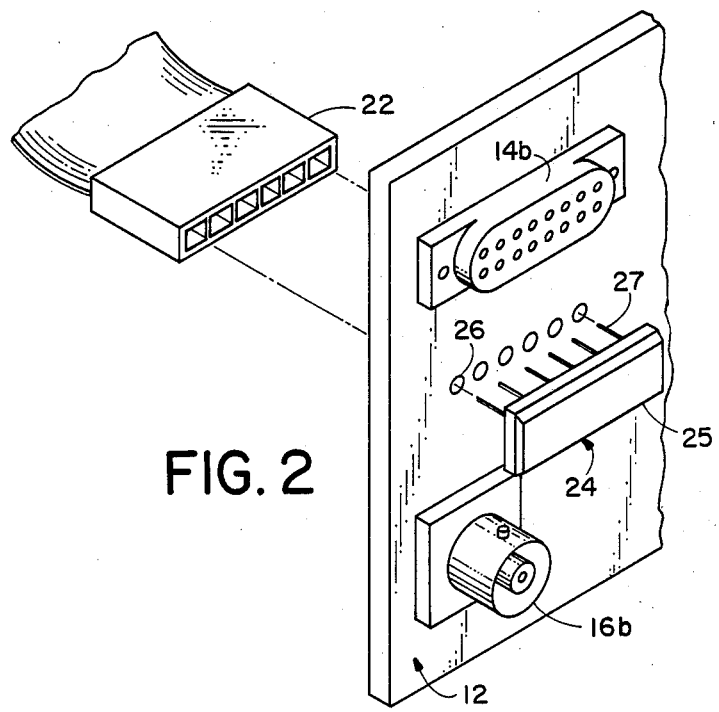
FIG. 2 is an enlarged, partially exploded, perspective view of part of the backplane proper of the apparatus shown in FIG. 1.

It will be noted that the arrangement described with reference to FIG. 2 allows electrical connections to be made between the backplane conductor runs and the conductors of the ribbon cable without exposing live circuit connections. The same result could be achieved in the event that the header component of the connector were connected to the cable and the posts were inserted through the backplane from the interior side, by fitting a receptacle-like shroud over the exposed ends of the posts.

It will be appreciated that the invention is not restricted to the particular apparatus that has been shown and described, since variations may be made therein without departing from the scope of the invention as defined in the appended claims, and equivalents thereof. For example, the invention is not restricted to the use of compliant pin connector technology, since other mating connector technologies may also be used. In the case of the illustrated apparatus, safety requirements dictate that the posts should not be exposed at the exterior of the apparatus, but where such requirements are not relevant the need to avoid exposing the posts does not arise. FIG. 3 shows, simply by way of example, and in highly diagrammatic fashion, a backplane board having four layers of dielectric material and three runs of conductive material. However, it will be appreciated that the board may have more or less runs, and that even with a fourlayer board many more than three runs could be provided by appropriate design of the layout of the runs. Moreover, although the body 25 is described as being made of dielectric material it could include a layer of conductive material in order to contain electromagnetic radiation from the ends of the posts 27. Thus, an internal shield layer could be incorporated in the body and be connected to a post that is grounded when the header 24 is installed in the backplane, or the body 25, as shown in FIG. 4, could be potted into a metal shell 40 that is conventionally connected by a tab 44 to a post 42 that is grounded when the header is installed.

I claim:

1. Electrical apparatus comprising a backplane board that comprises dielectric material and at least one run of conductive material that is selectively isolated from other conductive material by said dielectric material, said board being formed with an aperture that extends through the dielectric material and through said run of conductive material, whereby the conductive material is exposed at the interior surface of the aperture, and the apparatus also comprising a conductor member for connecting said run of conductive material to a component of the electrical apparatus, and connector means for establishing electrical connection between said run of conductive material and said conductor member, said connector means comprising a first connector member that is conductive and is secured to the conductor member, and a second connector member that is mechanically mateable with said first connector member, one of said connector members comprising an essentially rigid elongate member of conductive material that can be inserted into the aperture of the board from one side of the board to contact the run of conductive material and that, when so inserted, projects from the other side of the board, and the other connector member comprising a receptacle that can be fitted onto the portion of the elongate member that projects from said other side of the board, the connector means being such that when the elongate member is inserted into the aperture and its projecting portion is received in said receptacle, said first connector member is in electrical connection with said run of conductive material and the ends of the elongate member are completely enclosed.

2. Apparatus according to claim 1, wherein the interior of the aperture formed in the board contains a sleeve of metal adhered to the interior of the aperture and electrically connected with the run of conductive material.

3. Apparatus according to claim 1, wherein the elongate member is a pin-like member that is press fittable in the receptacle.

4. Apparatus according to claim 1, wherein said one connector member constitutes said second connector member and said other connector member constitutes said first connector member.

5. Apparatus according to claim 1, wherein said backplane board comprises a plurality of mutually insulated runs of conductive material and is formed with a plurality of apertures extending through the dielectric material and through said runs respectively, and the apparatus further comprises a plurality of conductor members for connection to said runs of conductive material respectively, said one connector member comprising a block of dielectric material and a plurality of essentially rigid elongate members of conductive material embedded in said block and insertable into respective apertures of the board from said one side of the board to contact the runs of conductive material respectively, and said other connector member defines a plurality of receptacles.

6. Apparatus according to claim 5, wherein said one connector member constitutes said second connector member and said other connector member constitutes said first connector member.

7. Apparatus according to claim 6, wherein said other connector member comprises a plurality of connector elements that are connected respectively to said conductor members and the elongate members of said one connector member are mounted to said block of dielectric material in mutually insulated fashion.

8. A backplane assembly for electrical apparatus, said backplane assembly comprising:
a backplane board having dielectric material and at least two runs of conductive material that are isolated from each other by said dielectric material, said board being formed with at least two apertures that extend through the dielectric material and through the runs of conductive material, whereby the conductive material of the runs is exposed at the interior surfaces of the respective apertures, and
connector means for establishing electrical connection between said runs of conductive material and respective conductor members, said connector means having a first connector member that includes a first body of dielectric material and at least two conductive contact elements for connection to said conductor members respectively and mounted in said first body of dielectric material in mutually insulated relationship, and a second connector member that includes a second body of dielectric material and is mechanically mateable with said first connector member, one of said connector members including at least two elongate, essentially rigid, conductive contact elements that are in mutually insulated relationship and can be inserted into said apertures respectively from one side of the board to contact said runs respectively and that, when so inserted, project from the other side of the board, and the other connector member having a receptacle that can be fitted onto the portion of the elongate element that projects from said other side of the board, the connector means being such that when the elongate elements are inserted into the apertures and their projecting portions are received in said receptacle, the contact elements of said first connector member are in electrical connection with said runs of conductive material and the ends of the elongate elements are completely enclosed.

9. A backplane assembly for electrical apparatus, said backplane assembly comprising:

a backplane board having dielectric material and at least one run of conductive material that is selectively isolated from other conductive material by said dielectric material, said board being formed with at least one aperture that extends through the dielectric material and through the run of conductive material, whereby the conductive material of the run is exposed at the interior surface of the aperture, and connector means for establishing electrical connection between said run of conductive material and a conductor member, said connector means having a first connector member that includes a conductive contact element for connection to the conductor member, and a second connector member that is mechanically mateable with said first connector member, one of said connector members having a body of dielectric material and an elongate, essentially rigid, conductive contact element that can be inserted into said aperture from one side of the board to contact said run and that, when so inserted, projects from the other side of the board and is shielded from contact at said one side of the board by said body of dielectric material, and the other connector member having a receptacle that can be fitted onto the portion of the elongate element that projects from said other side of the board, the connector means being such that when the elongate element is inserted into the aperture and its projecting portion is received in said receptacle, the contact element of said first connector member is in electrical connection with said run of conductive material, the receptacle completely enclosing the projecting portion of the elongate element.

10. A backplane connector for electrically connecting an electrical apparatus to a backplane, the backplane having a run of conductive material on a dielectric substrate with a plated-through hole in electrical contact with the run, comprising:

a first connector member on one side of the backplane;

a second connector member on the opposite side of the backplane from the first connector member, one of the first and second connector members being electrically connected to the electrical apparatus; and an elongate member extending through the plated-through hole to electrically connect the backplane to the one connector member at one end, the other end of the elongate member being insulatively covered by the other one of the first and second connector members, the ends of the elongate member being completely enclosed.

11. A backplane connector as recited in claim 10 further comprising means in the other connector member for electromagnetically shielding the other end of the elongate member.

* * * * *